United States Patent [19]

Ishizaki et al.

[11] Patent Number: 5,091,663
[45] Date of Patent: Feb. 25, 1992

[54] MESFET DIFFERENTIAL AMPLIFIER

[75] Inventors: Naoko Ishizaki, Urayasu; Atsushi Kameyama, Yokohama, both of Japan

[73] Assignee: Kabushiki Kaisha Toshiba, Kawasaki, Japan

[21] Appl. No.: 653,071

[22] Filed: Feb. 8, 1991

[30] Foreign Application Priority Data

Feb. 9, 1990 [JP] Japan ................... 2-28151

[51] Int. Cl.$^5$ ........................... H03F 3/45; H03F 3/16
[52] U.S. Cl. ............................ 307/530; 330/253
[58] Field of Search ............... 307/494, 497, 530; 330/253, 277

[56] References Cited

U.S. PATENT DOCUMENTS 4,656,371  4/1987  Binet et al. .................. 307/530 X

FOREIGN PATENT DOCUMENTS 59-162688  9/1984  Japan .

OTHER PUBLICATIONS

IEICE Spring National Convention Record: Minoru Togashi, Tohru Takada, Masao Ida; Mar. 1984.

Primary Examiner—Steven Mottola
Attorney, Agent, or Firm—Oblon, Spivak, McClelland, Maier & Neustadt

[57] ABSTRACT

A differential amplifier includes first and second normally off type MESFETs, which constitute a differential switching stage, sources of which are commonly connected to a current source, and gates of which are supplied with a signal input potential and a reference potential, respectively, third and fourth normally on type MESFETs connected at loads between the first MESFET and a voltage source and between the second MESFET and the voltage source, fifth and sixth normally off type MESFETs gates of which are connected to the drains of the first and second MESFETs, respectively, and drains of which are connected to the voltage source, and seventh and eighth MESFETs drains of which are connected to sources of the fifth and sixth MESFETs and output first and second output potentials and gates of which are applied with potentials having levels corresponding to the second and first output potentials, respectively.

24 Claims, 6 Drawing Sheets

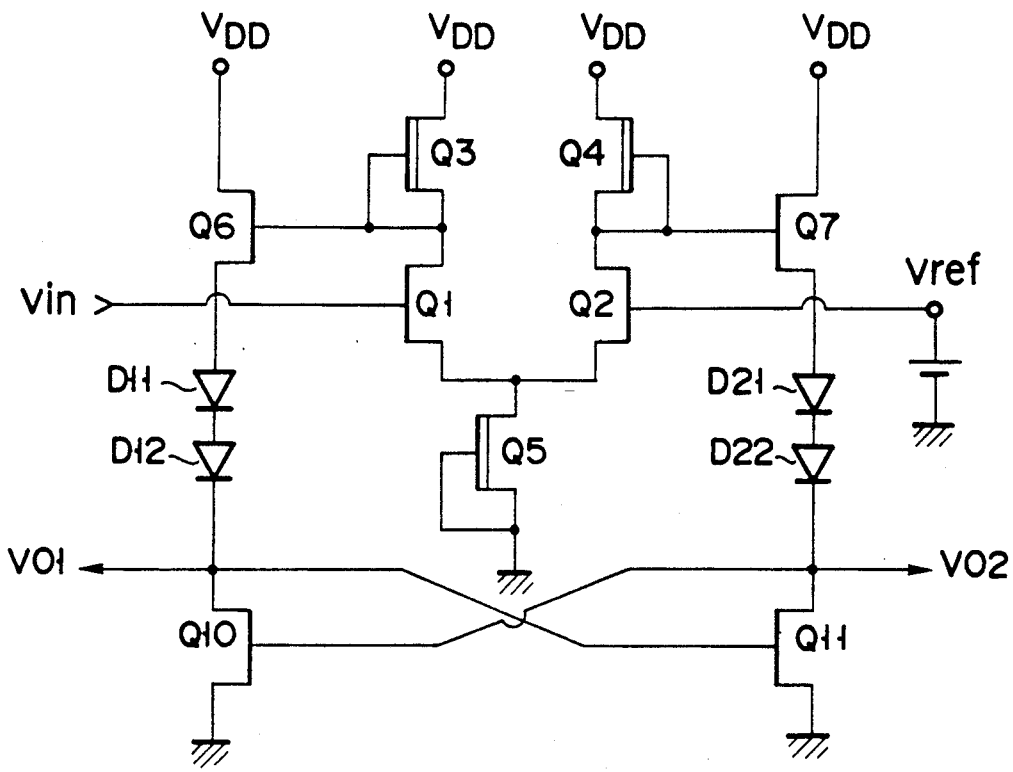
F I G. 1
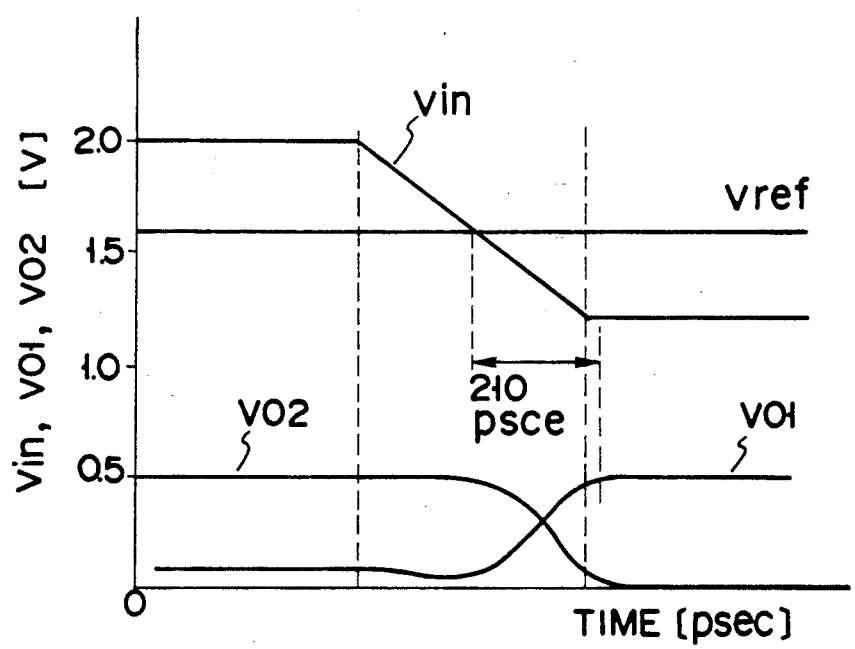
F I G. 2

5,091,663

MESFET DIFFERENTIAL AMPLIFIER

BACKGROUND OF THE INVENTION

1. Field of the Invention

The present invention relates to a differential amplifier which is utilized in a semiconductor integrated circuit and especially useful in a GaAs integrated circuit.

2. Description of the Related Art

A semiconductor integrated circuit using GaAs as a semiconductor has received attention as an integrated circuit which can be principally operated at a speed higher than that of a semiconductor integrated circuit using Si as a semiconductor. For this reason, a device requiring a high speed operation is frequently constituted by semiconductor integrated circuits using GaAs. For example, a high-speed memory device such as an SRAM (Static Random Access Memory) is constituted by semiconductor integrated circuits consisting of MESFETs (Metal Semiconductor Field Effect Transistors) using GaAs as a semiconductor. As the SRAM, a semiconductor circuit having an E/D arrangement using a normally off type FET (to be referred to as an EFET hereinafter) as a driver and using a normally on type EFT (to be referred to as a DFET hereinafter) as a load is generally used.

FIG. 6 is a block diagram showing a schematic arrangement of an SRAM.

The SRAM approximately consists of a memory cell array 1, a sense amplifier 4, and an output buffer 5. Data of the memory cell array 1 are selected by an X-address decoder 2 and a Y-address decoder 3 and read out to bit lines. Small output signals on the bit lines are amplified and transferred to the output buffer 5.

In the SRAM with the above arrangement, the most important circuit for deciding its performance is the sense amplifier 4. The sense amplifier 4 detects and amplifies a difference $\Delta V_1$ ($=V_{1H}-V_{1L}$) between an output $V_{1H}$ of "H" level on one of the pair of bit lines and an output $V_{1L}$ of "L" level on the other of the pair of bit lines. Therefore, the performance of the sense amplifier 4 depends on whether it can detect the small difference $\Delta V_1$ or not. As an index representing this performance, a sensitivity is used. The sensitivity is defined as a minimum difference $\Delta V_1$ required to output a signal capable of surely performing an ON/OFF operation of the sequential output buffer. For example, when a signal s having the difference $\Delta V_1 = 0.1$ V is input to the sense amplifier, the sense amplifier can surely output the signal s capable of surely performing an ON/OFF operation of the sequential output buffer. In this case, the sensitivity is given by 0.1 V or less.

As a register or the like used in a microprocessor, an SRAM having the arrangement shown in FIG. 6 is not used, and an SRAM having two read systems shown in FIG. 7 is frequently used. This SRAM has the following difference from the above-described SRAM. That is, input terminal of a sense amplifier 4₁ and to one input terminal of a sense amplifier 4₂, respectively, and a reference potential $V_{ref}$ is applied to the other input terminal of each of the sense amplifiers 4₁ and 4₂. In this case, a sensitivity $\Delta V_1$ is represented by a difference $|V_{in}-V_{ref}|$ between the input potential $V_{in}$ ($V_{1L}$ or $V_{1H}$) and the reference potential $V_{ref}$.

FIG. 8 shows a basic arrangement of a differential amplifier having an E/D arrangement and used as a sense amplifier of the above-described SRAM. This differential amplifier consists of driver EFETs $Q_1$ and $Q_2$ having sources commonly connected to a current source DFET $Q_5$ and load DFETs $Q_3$ and $Q_4$. The input/output transfer characteristics of the differential amplifier are largely changed depending on an amount of current capacity of FETs used in the differential amplifier (Published Unexamined Japanese Patent Application No. 59-162688). When the differential amplifier is used as a sense amplifier, in order to increase its sensitivity, it is desirable that the current capacity between the driver EFETs $Q_1$ and $Q_2$ is equal to that between the load DFETs $Q_3$ and $Q_4$. In the differential amplifier having the above arrangement, when a satisfactory sensitivity is to be obtained, an "L" level output is undesirably raised.

FIG. 9 shows a differential amplifier made to solve the above problem of raising the "L" level output (Published Unexamined Japanese Patent Application No. 59-162688). As a feature of the differential amplifier, a source follower circuit is provided to the output of the differential amplifier in FIG. 8 to have a function of a level shift. That is, source follower EFETs $Q_6$ and $Q_7$ are connected to output terminals s of the differential amplifier, respectively. The source of the EFET $Q_6$ is connected to a pull-down load DFET $Q_8$ through level shift diodes $D_{11}$ and $D_{12}$ consisting of Schottky diodes, and the source of the EFET $Q_7$ is connected to a pull-down loading DFET $Q_9$ through level shift diodes $D_{21}$ and $D_{22}$ consisting of Schottky diodes.

FIG. 10 shows an operating waveform of the differential amplifier in FIG. 9. When a node between outputs $V_{01}$ and $V_{02}$ has a capacitance load of 70 fF, this operating waveform is obtained by measuring the two outputs $V_{01}$ and $V_{02}$ under the conditions of VDD=2 V, $-0.4$ V $+V_{ref} \leq V_{in} \leq 0.4$ V $+V_{ref}$, and $V_{ref}=1.6$ V. In this case, the gate width and the threshold value of the FETs are summarized in Table 1.

TABLE 1

|  | Gate Width | Threshold Value |
|---|---|---|
| $Q_1$, $Q_2$ | 10 μm | 0.1 V |
| $Q_3$, $Q_4$ | 15 μm | −0.3 V |
| $Q_5$ | 30 μm | −0.3 V |
| $Q_6$, $Q_7$ | 30 μm | 0.1 V |
| $Q_8$, $Q_9$ | 15 μm | −0.3 V |

In FIG. 10, a difference between the time when curves of the potentials $V_{in}$ and $V_{ref}$ are crossed and the time when potential differences between the threshold value (0.3 V) of the output buffer with an E/D arrangement and the potentials $V_{01}$ and $V_{02}$ are to be 0.15 V is defined as a delay time $\tau d$. In this case, the delay time $\tau d$ is set up to 370 psec. Since the operating speed of the SRAM is controlled by the operating speed of the sense amplifier, in order to further increase the operating speed of the SRAM, the delay time of the sense amplifier is desirably shortened.

When the differential amplifier in FIG. 9 is integrated in fact, an operating range is disadvantageously small for divergence of the threshold value of an element. This phenomenon is described below with reference to FIG. 11.

In FIG. 11, the abscissa denotes a threshold value (design value of 0.1 V) $V_{th}$ of the EFET of the differential amplifier in FIG. 9, the ordinate denotes a threshold value (design value of −0.3 V) $V_{th}$ of the DFET in the differential amplifier, and a region A denotes a region where the differential amplifier can be operated, i.e., an allowable region for changing the threshold value s. In the region A, a region B indicated by hatched lines denotes a region where the differential amplifier can be operated even when an input potential difference $|V_{in} - V_{ref}|$ is set to be 0.1 V, i.e., a region where a sensitivity is set to be 0.1 V or less. As shown in FIG. 11, when the threshold value $V_{th}$ is shifted by only 0.1 V from −0.3 V to be −0.4 V, the sensitivity of 0.1 V cannot be obtained.

SUMMARY OF THE INVENTION

It is an object of the present invention to provide a differential amplifier capable of obtaining a high sensitivity even when a threshold value of an element is changed.

According to the present invention, in order to achieve the above object, a differential amplifier comprises first and second normally off type MESFETs ($Q_1$, $Q_2$) which constitute a differential switching stage, sources of which are commonly connected to a current source ($Q_5$), and gates of which are applied with a signal input potential and a reference potential, respectively; third fourth normally on type MESFETs ($Q_3$, $Q_4$) connected as loads between the first MESFET ($Q_1$) and a voltage source and between the second MESFET ($Q_2$) and the voltage source respectively; fifth and sixth normally off type MESFETs ($Q_6$, $Q_7$) gates of which are connected to the drains of the first and second MESFETs ($Q_1$, $Q_2$), respectively, and drains of which are connected to the power source; and seventh and eighth MESFETs ($Q_{10}$, $Q_{11}$, $Q_{10a}$, $Q_{11a}$) drains of which are connected to sources of the fifth and sixth MESFETs ($Q_6$, $Q_7$) and output first and second output potentials ($V_{01}$, $V_{02}$) and gates of which are applied with potentials having levels corresponding to the second and first output potentials ($V_{02}$, $V_{01}$), respectively.

According to another aspect of the present invention, a differential amplifier comprises first and second normally off type MESFETs ($Q_1$, $Q_2$), which constitute a differential switching stage, sources of which are commonly connected to a current source, and gates of which are applied with a signal input potential and a reference potential, respectively; third and fourth MESFETs normally on type ($Q_3$, $Q_4$) voltconnected as loads between the first MESFET ($Q_3$) and a voltage source and between the second MESFET ($Q_4$) and the voltage source, respectively; fifth and sixth normally off type MESFETs ($Q_6$, $Q_7$) gates of which are connected to the drains of the first and second MESFETs ($Q_1$, $Q_2$) and drains of which are connected to the power source, respectively; and seventh and eighth MESFETs ($Q_{10}$, $Q_{11}$) drains of which are connected to sources of the fifth and sixth MESFETs ($Q_6$, $Q_7$) and gates of which are connected to the sources of the sixth and fifth MESFETs ($Q_7$, $Q_6$).

According to still another aspect of the present invention, a differential amplifier comprises first and second normally off type MESFETs ($Q_1$, $Q_2$) which constitute a differential switching stage, sources of which are commonly connected to a current source, and gates of which are applied with a signal input potential and a reference potential, respectively; third and fourth MESFETs ($Q_3$, $Q_4$) connected as loads between the first MESFET ($Q_3$) and a voltage source and between the second MESFET ($Q_4$) and the voltage source, respectively; fifth and sixth normally off type MESFETs ($Q_6$, $Q_7$) gates of which are connected to the drains of the first and second MESFETs ($Q_1$, $Q_2$), respectively, and drains of which are connected to the voltage source; and seventh and eighth MESFETs ($Q_{10}$, $Q_{11}$) drains of which are connected to sources of the fifth and sixth MESFETs ($Q_6$, $Q_7$) and gates of which are connected to gates of the fourth and third MESFETs ($Q_4$, $Q_3$).

The MESFETs are preferably made of GaAs.

The seventh and eighth MESFETs are preferably normally-OFF type MESFETs.

The seventh and eighth MESFETs, however, may be normally-ON type MESFETs.

Level shift diodes are preferably connected between the fifth MESFET and the seventh MESFET and between the sixth MESFET and the eighth MESFET.

In the differential amplifier with the above arrangement, when the output signals from the seventh and eighth MESFETs are set to be "H" level and "L" level, signals of "L" level and "H" level are input to the gates of the seventh and eighth MESFETs, respectively. When output signals from the seventh and eighth MESFETs are set to be "L" level and "H" level, signals of "H" level and "L" level ar input to the gates of the seventh and eighth MESFETs, respectively. For this reason, as compared with a conventional differential amplifier, the "H" level output further goes to "H" level and the "L" level output further goes to "L" level. As a result, the seventh and eighth MESFETs can output signals having predetermined levels even when levels of the output signals from the differential amplifier body consisting of first, second, third, and fourth MESFETs are changed by a change in threshold value of the elements used in the circuit. Therefore, a wide operating range to the change in threshold value of the element can be obtained, and a differential amplifier having a high sensitivity can be obtained. In addition, when normally on type MESFETs are used as the seventh and eighth MESFETs, since a change in threshold value of the seventh and eighth MESFETs is the same as that of the fifth and sixth MESFETs, a variation in output level caused by the change in threshold value of the MESFETs can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a differential amplifier according to the first embodiment of the present invention;

FIG. 2 is a graph showing operation characteristics of the differential amplifier in FIG. 1;

DETAILED DESCRIPTION OF THE PREFERRED EMBODIMENTS

Figure 3:
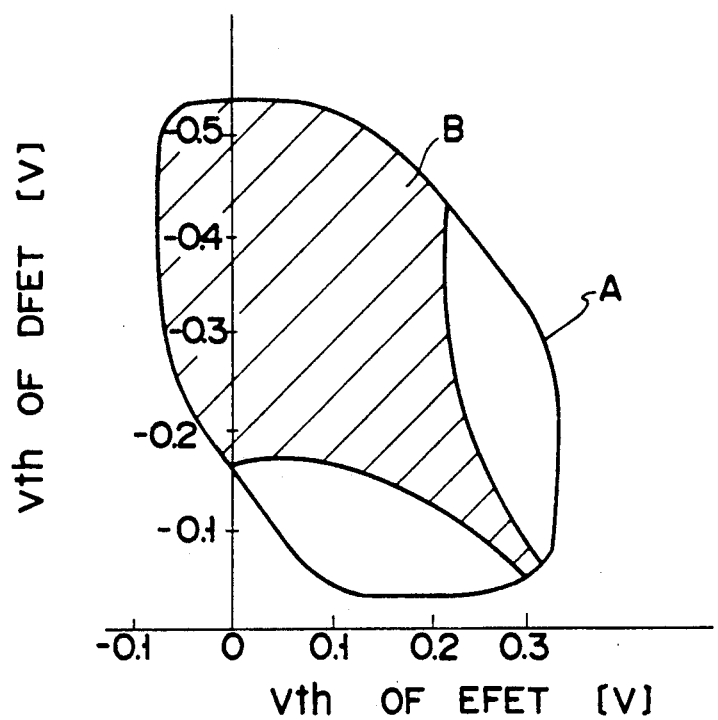
FIG. 3 is a graph showing an operating range as a function of a change in threshold value of the differential amplifier in FIG. 1.

Embodiments of the present invention will be described below with reference to the accompanying drawings.

FIG. 1 shows a differential amplifier according to the first embodiment of the present invention. The same reference numerals as in FIGS. 8 to 11 denote the same or corresponding parts in FIG. 1, and a detailed description thereof will be omitted.

The differential amplifier body comprises EFETs $Q_1$ and $Q_2$ sources of which are commonly connected to a current source DFET $Q_5$ to constitute a switching stage and DFETs $Q_3$ and $Q_4$ connected between the drain of the EFET $Q_1$ and a voltage source $V_{DD}$ and between the drain of the EFET $Q_2$ and the voltage source $V_{DD}$, respectively. Source follower EFETs $Q_6$ and $Q_7$ are connected to the drains of the EFETs $Q_3$ and $Q_4$ (respectively). The above arrangement is the same as the conventional arrangement. The source of the EFET $Q_6$ is connected to an EFET $Q_{10}$ serving as a load through level shift diodes $D_{11}$ and $D_{12}$ consisting of Schottky diodes, and the source of the EFET $Q_7$ is connected to an EFET $Q_{11}$ serving as a load through level shift diodes $D_{21}$ and $D_{22}$ consisting of Schottky diodes. The drain and gate of the load EFET $Q_{10}$ are connected to the gate and drain of the load EFET $Q_{11}$. That is, the load EFETs $Q_{10}$ and $Q_{11}$ constitute a flip-flop.

The basic operation of the differential amplifier is the same as that of a conventional differential amplifier. A fixed reference potential $V_{ref}$ is applied to the gate of the switching stage EFET $Q_2$, and an input potential $V_{in}$ is applied to the switching stage EFET $Q_1$. When the input potential $V_{in}$ is changed from, e.g., "H" level to "L" level, outputs $V_{o1}$ and $V_{o2}$ are level-shifted by a predetermined amount and go to "H" level and "L" level, respectively. At this time, the output $V_{o1}$ set to be "L" level is controlled by a potential of "H" level applied to the gate of the output stage EFET $Q_{10}$, and the output $V_{o2}$ set to be "L" level is controlled by a potential of "L" level applied to the gate of the output stage EFET $Q_{11}$. More specifically, positive feed back control is performed to the output stage EFETs $Q_{10}$ and $Q_{11}$. As a result, the ON resistance of the output stage EFET $Q_{10}$ is to be sufficiently small, and the OFF resistance of the output stage EFET $Q_{11}$ is to be sufficiently large. As compared with a conventional differential amplifier the output $V_{o2}$ of "H" level further goes to "H" level, and the output $V_{o1}$ of "L" level further goes to "L" level. For this reason, even when the source potentials of the source follower EFETSs $Q_6$ and $Q_7$ are shifted to low and high potentials with respect to a predetermined potential by a change in threshold value of the element, respectively, the output potentials $V_{o1}$ and $V_{o2}$ respectively go to predetermined "L" and "H" levels without any influence of this shift.

Thus, since the differential amplifier can surely output a signal at a predetermined level even when the threshold value is changed, it has a sensitivity higher than a conventional one. In this embodiment, since EFETs are used as the two source follower FETs, variations in threshold value are canceled. As a result, a wide operating range can be obtained.

Practical circuit characteristics will be described below. FIG. 2 is a graph showing an operating waveform of the differential amplifier in FIG. 1. This waveform corresponds to the operating waveform of a conventional differential amplifier shown in FIG. 10. More specifically, as in the prior art, when a node between the outputs $V_{o1}$ and $V_{o2}$ has a capacitance load of 70 fF, this waveform can be obtained by measuring the two outputs $V_{o1}$ and $V_{o2}$ under the conditions of $V_{DD}=2$ V, $=0.4+V_{ref} \leqq V_{in} \leqq 0.4$ V$+V_{ref}$, and $V_{ref}=1.6$ V. The gate widths and threshold values of the FETs used in the differential amplifier are summarized in Table 2 as follows.

TABLE 2

|  | Gate Width | Threshold Value |
|---|---|---|
| $Q_1$, $Q_2$ | 10 μm | 0.1 V |
| $Q_3$, $Q_4$ | 15 μm | −0.3 V |
| $Q_5$ | 30 μm | −0.3 V |
| $Q_6$, $Q_7$ | 30 μm | 0.1 V |
| $Q_8$, $Q_9$ | 15 μm | 0.1 V |

As is apparent from FIG. 2, "H" level of the outputs $V_{o1}$ and $V_{o2}$ is clamped to a level of 0.5 V which is the input clamp level of the sequential output buffer. A delay time $\tau d$ is set up to 210 psec. Therefore, the operating speed of the differential amplifier of this embodiment is increased by about 40% compared with that of a conventional differential amplifier.

FIG. 3 is a graph showing a region A where the differential amplifier can be operated as a function of a change in threshold value $V_{th}$ between the EFET and DFET and a region B where the sensitivity of the differential amplifier is set to be 0.1 V or less. This graph corresponds to that of the prior art in FIG. 11. As is apparent from comparison of this graph with that in FIG. 11, the region A and the region B where the sensitivity of 0.1V or less can be obtained are largely increased with a change in threshold value.

The present inventors applied the differential amplifier of this embodiment to a GaAs MESFET-SRAM of 128 words×32 bits. As a result, the threshold value of the EFET was set to be 0.1 V as a design value, and it was confirmed to normally operate the SRAM even when the threshold value of the DFET was set to be −0.5 V (design value of −0.3).

Figure 4:
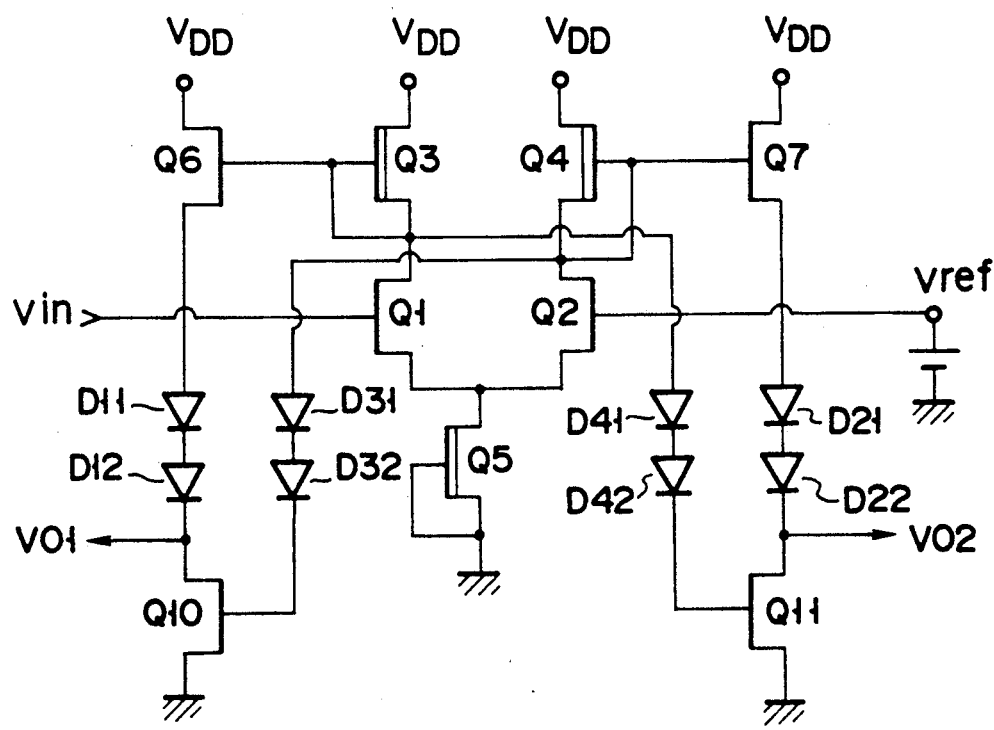
FIG. 4 is a circuit diagram showing a differential amplifier according to the second embodiment of the present invention.

FIG. 4 is a view showing a differential amplifier according to the second embodiment of the present invention. The same reference numerals in FIG. 4 denote the same parts as in FIG. 1, and a detailed description thereof will be omitted.

This differential amplifier is different from differential amplifier of the first embodiment in the following point. A feed back loop to the gates of output stage EFETs $Q_{10}$ and $Q_{11}$ is formed independently of a source follower stage. That is, the drain of an EFET $Q_2$ serving as the output node of the main body of the differential amplifier is connected to the gate of the EFET $Q_{10}$ through level diodes $D_{31}$ and $D_{32}$, and the drain of an EFET $Q_1$ is connected to the gate of the EFET $Q_{11}$ through the level shift diode $D_{41}$ and $D_{42}$.

Even in the differential amplifier with the above arrangement, the output stage EFETs $Q_{10}$ and $Q_{11}$ are subjected to positive feedback as in the first embodiment. Therefore, the same operating characteristics as described in the first embodiment can be obtained, and a differential amplifier having sensitivity higher than that of a conventional differential amplifier can be obtained.

Figure 5:
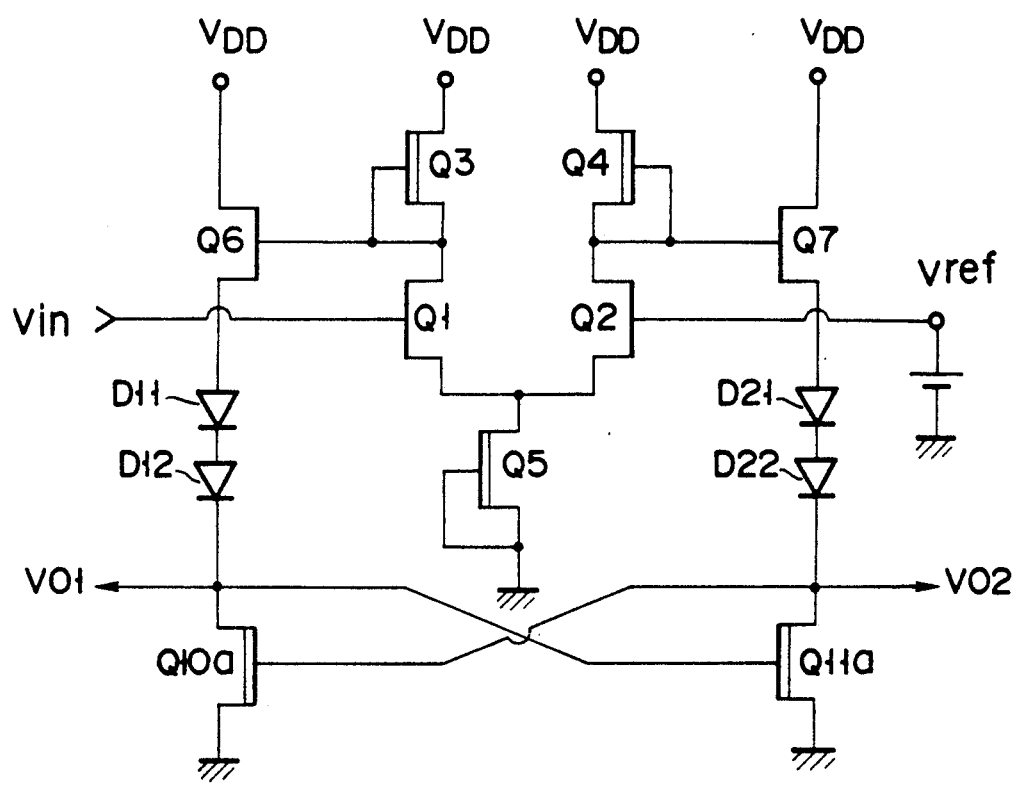
FIG. 5 is a circuit diagram showing a differential amplifier according to the third embodiment of the present invention.
Figure 6:
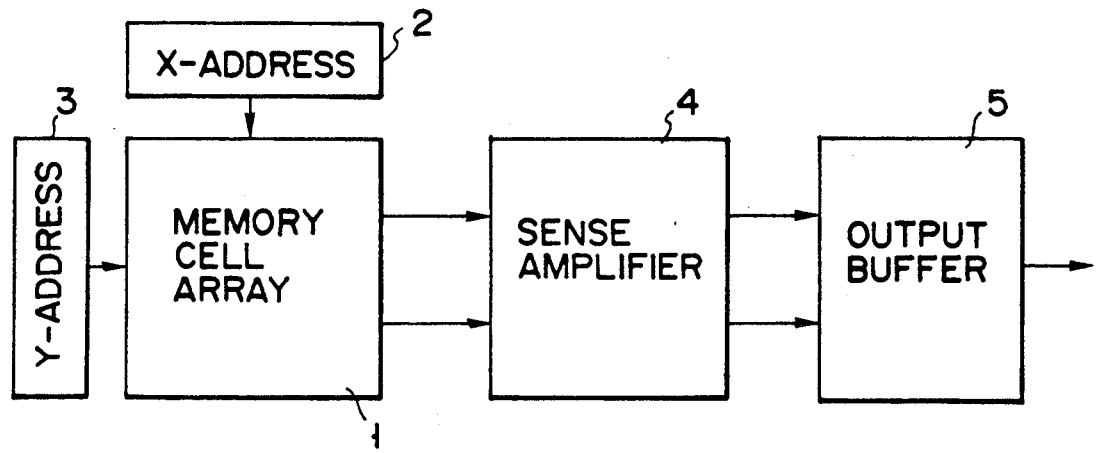
FIG. 6 is a block diagram showing a basic arrangement of an SRAM.
Figure 7:
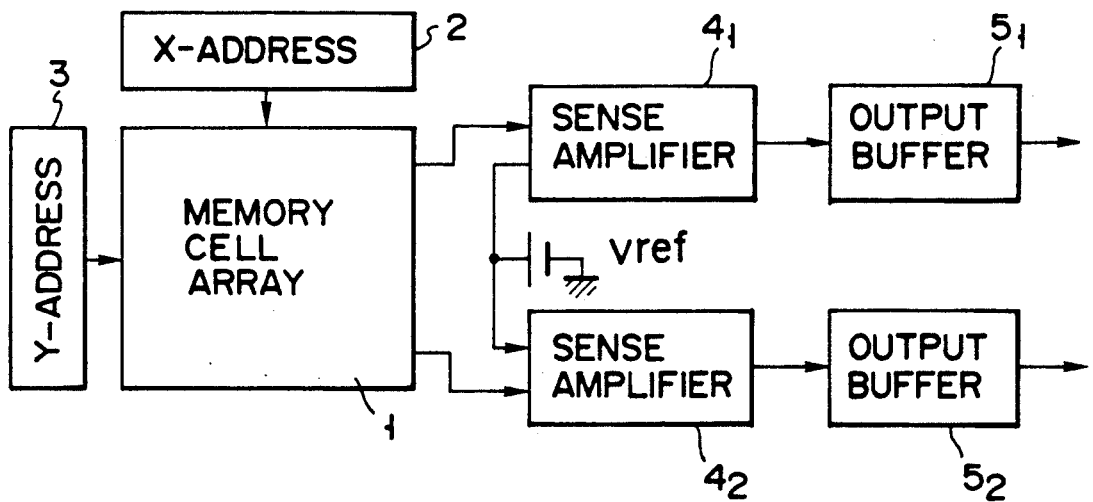
FIG. 7 is a block diagram showing an arrangement of another SRAM.
Figure 8:
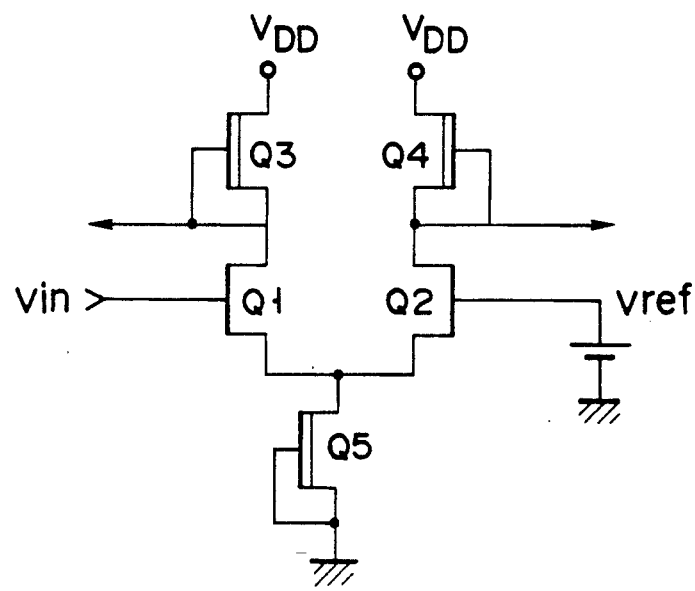
FIG. 8 is a circuit diagram showing a basic arrangement of a conventional differential amplifier.
Figure 9:
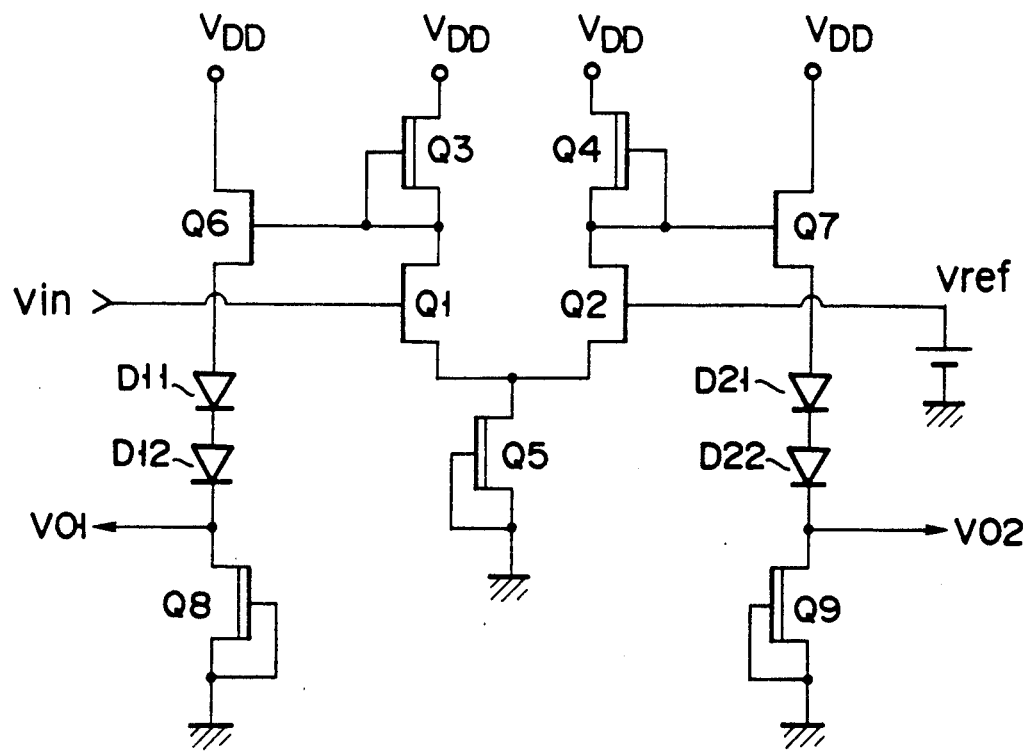
FIG. 9 is a circuit diagram showing a conventional differential amplifier having a level shift function.
Figure 10:
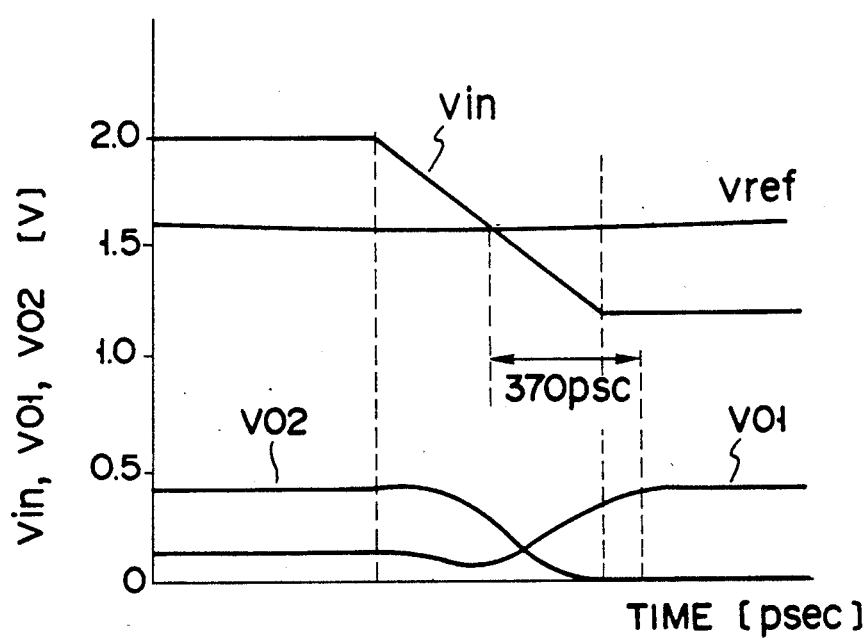
FIG. 10 is a graph showing operation characteristics of the differential amplifier in FIG. 9.
Figure 11:
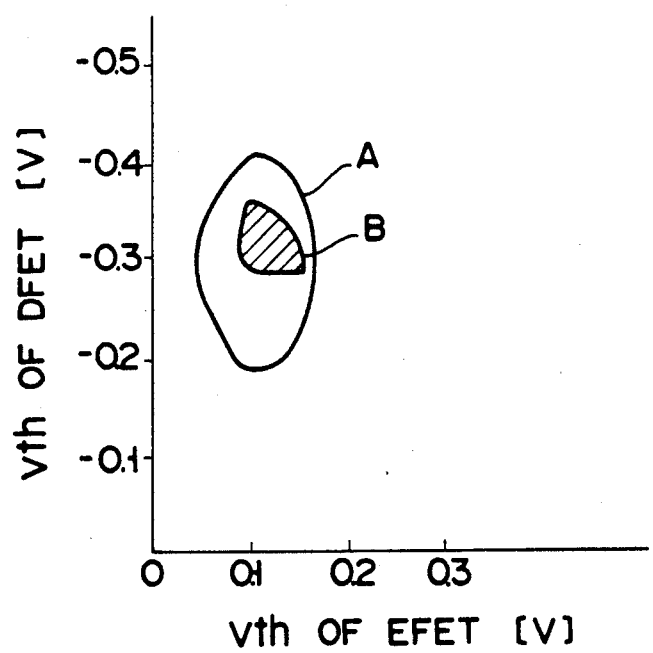
FIG. 11 is a graph showing an operating range as a function of a change in threshold value of the differential amplifier in FIG. 9.

FIG. 5 shows a differential amplifier according to the third embodiment of the present invention. The same reference numerals as in FIG. 1 denote the same parts in FIG. 5, and a detailed description thereof will be omitted.

This differential amplifier is different from the differential amplifier of the second embodiment in the following point. As loads, normally on type FETs $Q_{10a}$ and $Q_{11a}$ are used in place of the normally off type FETs $Q_{10}$ and $Q_{11}$.

Even in the differential amplifier with above arrangement, since the FETs $Q_{10a}$ and $Q_{11a}$ serve as loads and the EFETs $Q_{10}$ and $Q_{11}$ are subjected to positive feedback, the same effect as described in the first and second embodiments can be obtained.

The present invention is not limited to the above embodiments. For example, the gates of the FETs $Q_{10}$ and $Q_{11}$ ($Q_{10a}$ and $Q_{11a}$) may be connected to the gates of the FETs $Q_1$ and $Q_2$. In short, a potential is applied to the FETs $Q_{10}$ and $Q_{11}$ such that positive feedback is performed to the FETs $Q_{10}$ and $Q_{11}$. In the above embodiments, a case wherein a Schottky diode is used as a level shift diode is described. However, even if a p-n junction diode is used, the same effect as described above can be obtained. In addition, a MESFET using a semiconductor other than GaAs may be used.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A differential amplifier comprising:
   first and second normally off type MOSFETs which constitute a differential switching stage, sources of which are commonly connected to a current source, and gates of which are applied with a signal input potential and a reference potential, respectively;
   third and fourth normally on type MESFETs connected as loads between said first MESFET and a voltage source and between said second MESFET and the voltage source, respectively;
   fifth and sixth normally off type MESFETs gates of which are connected to the drains of said first and second MESFETs, respectively, and drains of which are connected to the voltage source; and
   seventh and eight MESFETs drains of which are connected to sources of the fifth and sixth MESFETs and output first and second output potentials and gates of which are applied with potentials having levels corresponding to said second and first output potentials, respectively.

2. A differential amplifier according to claim 1, wherein said MESFETs consist of GaAs.

3. A differential amplifier according to claim 1, wherein said seventh and eighth MESFETs are normally off type MESFETS.

4. A differential amplifier according to claim 1, wherein said seventh and eighth MESFETs are normally on type MESFETs.

5. A differential amplifier according to claim 1, further comprising level shift elements connected between said fifth MESFET and said seventh MESFET and between said sixth MESFET and said eighth MESFET.

6. A differential amplifier according to claim 5, wherein said level shift elements consist of diodes.

7. A differential amplifier according to claim 6, wherein said diodes are Schottky diodes.

8. A differential amplifier according to claim 6, wherein said diodes are p-n junction diodes.

9. A differential amplifier comprising:
   first and second normally off type MESFETs which constitute a differential switching stage, sources of which are commonly connected to a current source, and gates of which are applied with a signal input potential and a reference potential, respectively;
   third and fourth normally on type MESFETs connected between said first MESFET and a voltage source and between said second MESFET and the voltage source as loads, respectively;
   fifth and sixth normally off type MESFETs gates of which are connected to the drains of said first and second MESFETs and drains of which are connected to the voltage source, respectively; and
   seventh and eighth MESFETs drains of which are connected to sources of said fifth and sixth MESFETs and gates of which are connected to the sources of said sixth and fifth MESFETs.

10. A differential amplifier according to claim 9, wherein said MESFETs consist of GaAs.

11. A differential amplifier according to claim 9, wherein said seventh and eighth MESFETs are normally off type MESFETs.

12. A differential amplifier according to claim 9, wherein said seventh and eighth MESFETs are normally on type MESFETs.

13. A differential amplifier according to claim 9, further comprising level shift elements connected between said fifth MESFET and said seventh MESFET and between said sixth MESFET and said eighth MESFET.

14. A differential amplifier according to claim 13, wherein said level shift elements consist of diodes.

15. A differential amplifier according to claim 14, wherein said diodes are Schottky diodes.

16. A differential amplifier according to claim 14, wherein said diodes are p-n junction diodes.

17. A differential amplifier comprising:
   first and second normally off type MESFETs which constitute a differential switching stage, sources of which are commonly connected to a current source, and gates of which are applied with a signal input potential and a reference potential, respectively;
   third and fourth MESFETs connected as loads between said first MESFET and a voltage source and between said second MESFET and the voltage source, respectively;

fifth and sixth normally off type MESFETs gates of which are connected to the drains of said first and second MESFETs, respectively, and drains of which are connected to the voltage source; and seventh and eighth MESFETs drains of which are connected to sources of said fifth and sixth MESFETs and gates of which are connected to gates of said fourth and third MESFETs.

18. A differential amplifier according to claim 17, wherein said MESFETs consist of GaAs.

19. A differential amplifier according to claim 17, wherein said seventh and eighth MESFETs are normally off type MESFETs.

20. A differential amplifier according to claim 17, wherein said seventh and eighth MESFETs are normally on type MESFETs.

21. A differential amplifier according to claim 17, further comprising level shift elements connected between said fifth MESFET and said seventh MESFET and between said sixth MESFET and said eighth MESFET.

22. A differential amplifier according to claim 21, wherein said level shift elements consist of diodes.

23. A differential amplifier according to claim 22, wherein said diodes are Schottky diodes.

24. A differential amplifier according to claim 22, wherein said diodes are p-n junction diodes.

* * * * *